(12) United States Patent
Sedlak (10) Patent No.: US 7,782,108 B2
(45) Date of Patent: Aug. 24, 2010

(54) FLIP-FLOP DEVICE AND METHOD FOR STORING AND OUTPUTTING A DATA VALUE

(75) Inventor: Holger Sedlak, Lochhofen (DE)

(73) Assignee: Infineon Technologies AG, Neubiberg (DE)

( * ) Notice: Subject to any disclaimer, the term of this patent is extended or adjusted under 35 U.S.C. 154(b) by 256 days.

(21) Appl. No.: 11/563,062

(22) Filed: Nov. 24, 2006

(65) Prior Publication Data

US 2007/0146032 A1 Jun. 28, 2007

(30) Foreign Application Priority Data

Nov. 25, 2005 (DE) .................. 10 2005 056 278

(51) Int. Cl.
*H03K 3/356* (2006.01)
(52) U.S. Cl. .................. 327/211; 327/212; 327/208; 327/218
(58) Field of Classification Search .................. 327/118, 327/210–212, 199–203, 208, 218, 225
See application file for complete search history.

(56) References Cited

U.S. PATENT DOCUMENTS

| | | | |
|---|---|---|---|
| 4,417,161 A * | 11/1983 | Uya | .................. 326/55 |
| 5,250,858 A | 10/1993 | Strong | |
| 6,300,809 B1 | 10/2001 | Gregor et al. | |
| 6,400,199 B1 | 6/2002 | Liu et al. | |
| 6,438,023 B1 * | 8/2002 | Johnson | .................. 365/154 |
| 6,489,825 B1 | 12/2002 | Pasqualini | |
| 6,822,478 B2 * | 11/2004 | Elappuparackal | .................. 327/199 |
| 7,411,425 B2 * | 8/2008 | Belluomini et al. | .................. 326/121 |
| 2004/0041610 A1 | 3/2004 | Kundu | |
| 2004/0114702 A1 | 6/2004 | Friedman et al. | |

OTHER PUBLICATIONS

A.G.M. Strollo et al.; "Low power flip-flop with clock gating on master and slave latches"; Electronics Letters, Feb. 17, 2000, vol. 36, No. 4, pp. 294-295.*
Chulwoo Kim et al.; "A Low-Swing Clock Double-Edge Triggered Flip-Flop"; IEEE Journal of Solid-State Circuits, vol. 37, No. 5, May 2002, pp. 648-652.*
Y. Xia et al.; "Differential CMOS edge-triggered flip-flop with clock-gating"; *Electronics Letters*, Jan. 3, 2002, vol. 38, No. 1, pp. 9-11.
U. Tietze et al.; "Halbleiter-Schaltungstechnik"; Springer-Verlag, 1989, p. 238.

* cited by examiner

*Primary Examiner*—Long Nguyen
(74) *Attorney, Agent, or Firm*—Dickstein, Shapiro, LLP.

(57) ABSTRACT

A flip-flop device for storing and outputting a data value includes a controllable memory element configured to be open as a function of a control pulse, a feedback means for comparing a data value present at the memory element and the data value output by the memory element, and for outputting a comparison signal, and a control pulse generator for generating the control pulse as a function of the comparison signal, so that the control pulse generator is put in an activated state when the comparison signal is high, so as to then, in the activated state, open the memory element in response to a clock event. The memory element will then be closed again when the comparison signal indicates that the same values are present at the output and at the input of the memory element.

18 Claims, 11 Drawing Sheets

FLIP-FLOP DEVICE AND METHOD FOR STORING AND OUTPUTTING A DATA VALUE

CROSS-REFERENCE TO RELATED APPLICATION

This application claims priority from German Patent Application No. 102005056278.7, which was filed on Nov. 25, 2005, and is incorporated herein by reference in its entirety.

BACKGROUND

The present invention relates to flip-flops and in particular to D-type flip-flops which are suitable for particularly high clock rates.

The specialist publication "A Low-Swing Clock Double Edge Triggered Flip-Flop," IEEE, Journal of Solid-State Circuits, Vol. 37, No. 5, May 2002, discloses a flip-flop having reduced power consumption in comparison with conventional flip-flops. In particular, unnecessary transitions of internal nodes are avoided to reduce power consumption. In addition, a trigger operation is used both for the rising and for the falling clock edges, so that the clock frequency may be reduced in comparison with single-edge triggered flip-flops.

US patent publication US 2004/0114702 A1 discloses a phase detector having a first flip-flop for sampling an incoming signal in accordance with a first local clock signal to generate a first sampled data signal, a second flip-flop for sampling the incoming data signal in accordance with a second local clock signal to generate a second sampled data signal, and a third flip-flop for sampling the second sampled data signal, on the basis of the first sampled data signal, to generate a binary control signal. The third flip-flop comprises a double-edge triggered flip-flop.

U.S. Pat. No. 5,250,858 discloses a double-edge triggered memory device, wherein the output signal is updated both at the rising and the falling edges of a clock input signal.

U.S. Pat. No. 6,300,809 B1 discloses a double-edge flip-flop providing two data transitions per clock cycle. In particular, a delayed version of the clock signal is provided in addition to the clock. In addition, two transparent latches comprising clock inputs are provided which are controlled by opposite polarities of the delayed clock signal. Finally, a multiplexer is provided, the inputs of which are fed by output signals of the latches, a select input of the multiplexer being fed by the clock signal. Moreover, a select signal is provided for selecting that latch whose clock is inactive.

U.S. Pat. No. 6,489,825 B1 discloses a fast double-edge flip-flop having low power and area consumptions. An inverter, a pair of latches, and a two-to-one multiplexer are thus employed. A first latch outputs a first signal in response to a first data signal when a clock signal is in a first state, and stores the logic state of the first signal when the clock signal is in a second logic state. A second latch outputs a second signal in response to a second data signal when the clock signal is in the second logic state, and stores the logic state of the second signal when the clock signal is in the first logic state. The multiplexer controls the logic state of the flip-flop output signal in response to the logic state of the first signal when the clock signal is in the second logic state, and in response to the logic state of the second signal when the clock signal is in the first logic state.

US patent application US 2004/0041610 A1 discloses a scan design for double-edge triggered flip-flops. The double-edge flip-flop scan cell provides the ability to detect and output data at each edge of a clock signal in a functional mode of an integrated circuit. In a test mode, the double-edge triggered clip-flop scan cell enables test data to be scanned into and out of the scan cell, so as to provide an observability and controllability of the internal state of the scan cell.

U.S. Pat. No. 6,438,023 B1 discloses a double-edge clocked memory device, triggered either by the rising edge, the falling edge or by both edges of a clock signal. Cross-coupled inverters at the inputs are provided to realize short and potentially negative setup times. Cross-coupled tri-state inverters at the outputs improve the clock-to-data times. A pre-charge evaluation method is used to transfer data for storing both at the rising and at the falling edges of the clock signal. Inverters having weak feedback are optionally used to maintain the state of the memory device in the absence of a clock signal.

U.S. Pat. No. 6,400,199 B1 discloses a double-edge triggered difference flip-flop comprising a first difference master circuit, a second difference master circuit, and a difference slave circuit. The first master circuit stores the first input value during the time duration from the leading edge to the trailing edge of the clock. The second master circuit stores the second input value during the time duration from the trailing edge to the leading edge of the clock. The slave circuit is electrically connected to the outputs of the first and second master circuits. The slave circuit comprises a second repeater as the output end of the flip-flop, outputs the first input value at the trailing edge of the clock, and outputs the second input value at the leading edge of the clock.

Figure 12:
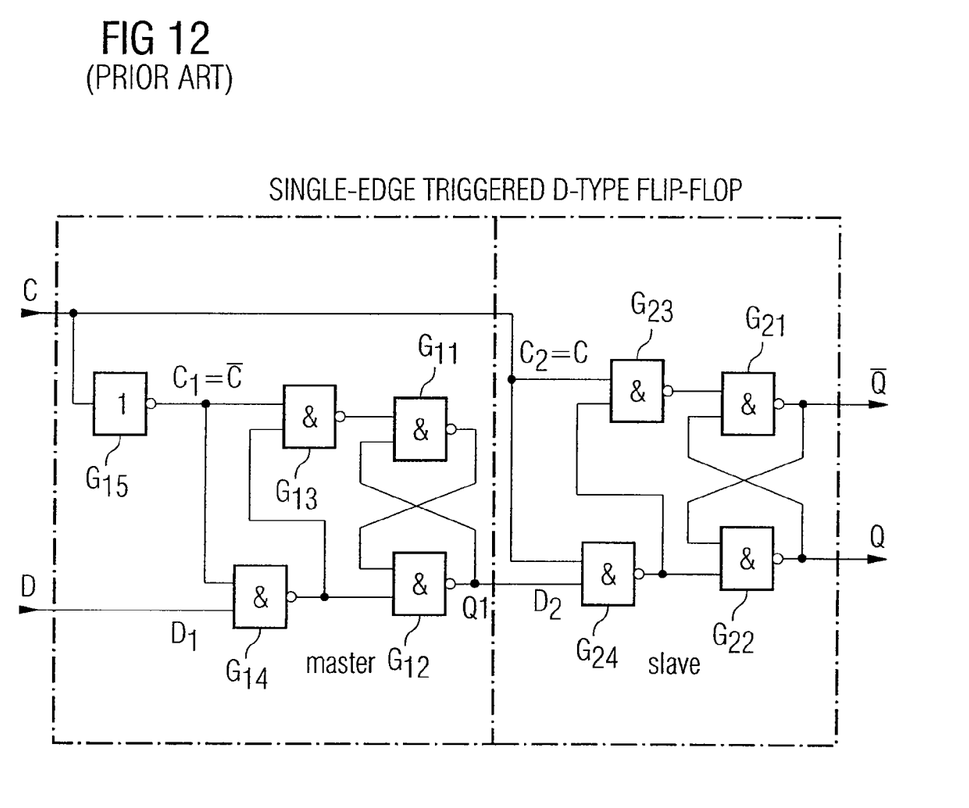
FIG. 12 is a known single-edge triggered D-type flip-flop.

FIG. 12 shows a typical single-edge triggered D-type flip-flop as is presented in "Halbleiter-Schaltungs-Technik", U. Tietze, CH. Schenk, page 238, Springer-Verlag, 1989. In principle, the flip-flop is a master-slave structure. A slave latch formed from inverters G21 and G22 is supplied with the data value of a master latch formed from inverters G11, G12, when a clock transition occurs. For example, in the D-type flip-flop depicted in FIG. 12, a data value is sampled by the master latch and, once the clock changes its state, stored into the slave latch and output as a data value Q and/or as an inverted data value, $\overline{Q}$. As long as the clock is C=0, the master follows the input signal, and it becomes $Q_1$=D. Meanwhile, the slave stores the old state. When the clock goes to 1, the information D present in this moment is frozen within the master and transferred to the slave and, thus, to the Q output. The information present at the D input at the positive clock edge is thus currently transferred to the Q output. During the remaining time, the state of the D input is without influence. Unlike a JK flip-flop comprising entry blocking, the value read in does not appear as late as at the negative clock edge at the output, but appears immediately. Thus, an advantage of this circuit is the fact that now the entire clock period duration is available for forming the new D signals. When using JK flip-flops, this process must be performed while the clock is 0, i.e. within half the time at a symmetrical clock.

Generally, different characteristic quantities exist with such flip-flops. The time of "CLK2Q" indicates the amount of time one has to wait, starting from a clock event, i.e., for example, from rising or falling clock edges, until that data value which at the time of the clock event was present at the input, appears on the output side.

Thus, it is absolutely necessary to take care, with the flip-flop depicted in FIG. 12, that the slave flip-flop is not opened before the master flip-flop has neatly closed. On the other hand, the master flip-flop must be opened for a sufficiently long time so that the data value at the D input is neatly stored in the master flip-flop. Eventually, the slave flip-flop must be opened for a sufficiently long time so that the data value taken over by the master latch is neatly read into the slave latch.

All these processes, i.e. storing a data value into the master latch, transferring the data value from the master latch to the slave latch, and the data value being fully taken over by the slave latch, must occur within a single clock cycle.

To ensure all these time periods for specific temperature states of a circuit and other external circumstances occurring in the operation of a circuit, so as to prevent any calculation errors from occurring, safety margins are envisaged which are all at the expense of the clock frequency. On the other hand, the clock frequency is responsible for a processor being operated fast. In addition, the power consumption is also associated with the clock frequency. If the clock frequency is higher, i.e. if a larger number of switching transitions occur, the power consumption will also be higher, whereas the power consumption becomes lower when the clock frequency is reduced.

Within a typical logic circuit, many flip-flops exist in many locations. All of these flip-flops must be supplied with a clock, which is provided to the individual flip-flops via a so-called clock tree. This clock tree by now contributes to the current consumption of a circuit at a quite considerable percentage. Therefore, one will strive to have double-edge triggered flip-flops, since the clock frequency may be reduced by half in comparison with single-edge triggered flip-flops. On the other hand, sufficient safety margins must nevertheless be maintained for the individual data transitions within the flip-flop, particularly large safety margins being necessary specifically for correctly reading in a data value into a latch, since a calculation error will occur if the reading-in of a data value into a latch is not ensured.

However, these margins result in that lower clock frequencies can be employed. What is also problematic about these margins is the fact that they will not actually be exhausted for a typical normal operation, but that because of these margins, i.e. for safety reasons, the clock frequency cannot be ramped up to the extent that would actually be desired.

BRIEF DESCRIPTION OF THE DRAWINGS

These and other objects and features of the present invention will become clear from the following description taken in conjunction with the accompanying drawing, in which.

DESCRIPTION OF PREFERRED EMBODIMENTS

The present invention provides an improved flip-flop concept.

In accordance with a first aspect, the invention provides a flip-flop device for storing and outputting a data value, including:

a controllable memory element controllable to be opened as a function of a control pulse, to store a data value present, and to output it on the output side;

a feedback unit for comparing a data value present and a value output by the memory element, and for outputting a comparison signal; and a control pulse generator for generating the control pulse as a function of the comparison signal.

In accordance with a second aspect, the invention provides a method for storing and outputting a data value, the method including the steps of:

storing a present data value by means of a controllable memory element which is controllable to be open as a function of a control pulse, and outputting the stored data value on the output side;

comparing a present data value and a value output by the memory element, and outputting a comparison signal; and generating the control pulse as a function of the comparison signal.

The present invention is based on the findings that a feedback means is provided to compare a data value which has been output by a memory element to a data value which has been input into the memory so as to derive a comparison signal from this comparison. This comparison signal is used to generate a control pulse for a controllable memory element so that it is no longer necessary to work with safety margins for the correct storing of a data value into a latch. Instead, the present invention now provides a control of whether a data value is stored within a latch, so that the latch can be closed at the precise moment when the value has been stored correctly, or is left open if the value has not yet been stored correctly. Therefore, the latch is automatically opened, without safety margins, for a sufficient time period so that safe storing of the data value is achieved, i.e. it is "self-timed".

In a preferred embodiment of the present invention, the comparison signal is additionally used to activate a pulse generator for controlling the memory only when different situations are at hand on the input and output sides with regard to the memory. This also ensures that within the flip-flop, a switch-over is performed only when on the input side, e.g., a new data value is also present which differs from the previous data value. A pulse generator for providing the control pulse is thus activated by the comparison signal if the latter indicates different states at the input and at the output of the latch. Then, when, e.g., a rising edge of a clock arrives, the latch will be opened. The latch will then remain open for such time until the feedback means indicates that the data value has been correctly stored into the latch, i.e. that the input and output values are the same. The latch will then be closed again. This closing is achieved in that the comparison signal returns to the 0 state. If the comparison signal transitions to a 1 state in a later cycle, i.e. if different states are again present at the input and output of the flip-flop, the pulse generator is activated again so as to open the latch when another clock event arrives, such as a rising edge and a falling edge—the latch remaining open exactly for such time until the data value is stored in correctly, and the latch being closed again immediately.

Thus, in accordance with the invention, the opening of the latch is achieved starting from a clock edge, whereas the closing of the latch is performed immediately after a data value having been stored in correctly. Thus, no more safety margins need be employed. Instead, the latch is kept open, under all circumstances, for such time until a value has been read in correctly. Unlike applications wherein a safety margin had to be maintained, the clock may thus be increased, since the inventive concept will ensure that a data value is read into the latch correctly.

In addition, in comparison with the master-slave concept, only one single latch is necessary, which is why transistors and, thus, chip area, and consequently, naturally, power consumption are saved.

In addition, the inventive concept is very design-friendly, since all the elements, i.e. the memory element, the feedback means, and the control pulse generator, may be developed using standard design techniques. Despite the fact that no more master-slave structure is employed, double-edge triggering is nevertheless made possible in accordance with the invention, which immediately results in a 50% reduction of the current consumption within the clock tree.

The pulse generator at the flip-flop input in accordance with the present invention is self-timed, so that depending on the implementation, it is possible to employ also single-edge triggered flip-flops rather than only double-edge triggered flip-flops. However, for the design, the usual concepts of the standard tool flows are employed. Thus, no application-specific clock-tree adaptations are performed as have been conducted in special high-performance designs in order to achieve high clock frequencies.

Due to the inventive control pulse generator controlled by the feedback means and arranged at the clock input of a standard flip-flop, it is also possible to achieve a reduced transistor count in comparison with standard flip-flops. In addition, reduced silicon area consumption is also achieved.

Preferred embodiments of the present invention include transistor implementations wherein common flip-flop requirements are realized by making only slight changes, such as a set input, a reset input, an enable input, or negated implementations for the various flip-flop devices.

Figure 1:
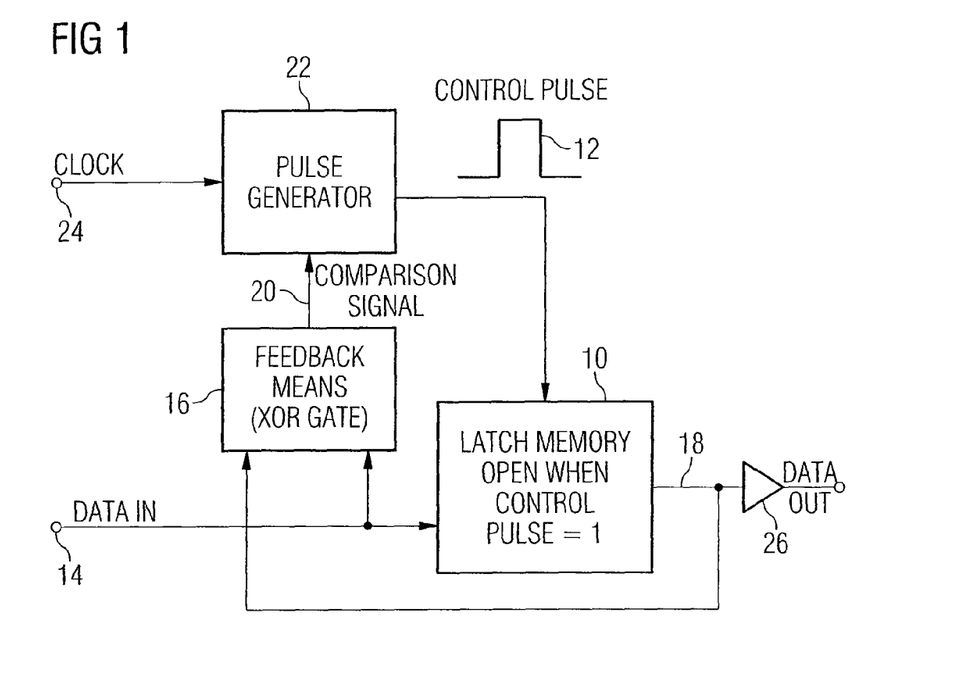
FIG. 1 is a schematic block diagram of an inventive flip-flop device.
Figure 2:
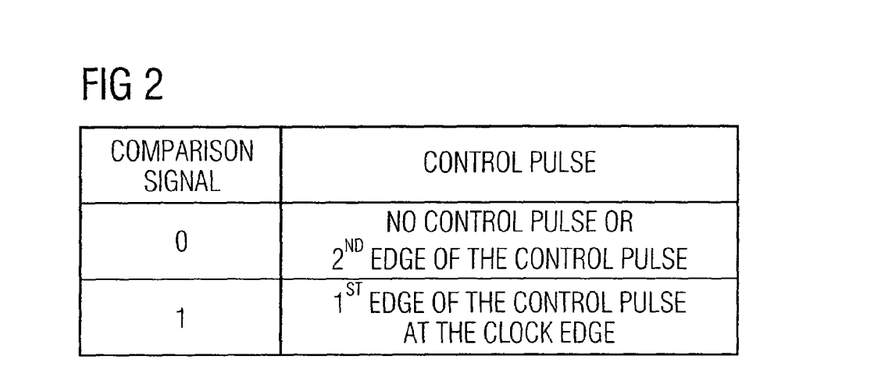
FIG. 2 is a tabular representation of the connection between a comparison signal and a control pulse.

FIG. 1 shows an inventive flip-flop device for storing and outputting a data value. The flip-flop device includes a controllable memory element 10 which is preferably configured as a latch memory and is controllable to be opened as a function of a control pulse 12 so as to store a present data value and to output it on the output side. The data value is input via a data input 14. The inventive flip-flop device further includes a feedback means 16 for comparing a data value present at a latch memory input and a value, output by the memory element, at an output 18, and for outputting a comparison signal 20 which depends on the memory input value and the memory output value. The comparison signal 20 is fed into a control pulse generator 22 to generate the control pulse 12 as a function of the comparison signal. In addition, the control pulse generator is coupled to a clock input 24 so as to also use the clock at clock input 24 for generating the control pulse.

If the comparison signal 20 equals 0, i.e. if the input and output data of the latch memory is identical, no control pulse will be generated, i.e. the pulse generator 22 will be deactivated. However, if the control pulse was in a high state already, and if there is subsequently a transition of the comparison signal from a 1 state to a 0 state, the second edge, i.e., the falling edge of control pulse 12, will be generated when the comparison signal transitions to the 0 state.

If the comparison signal transitions to the 1 state, this means that different values are present at the input and at the output of the latch memory. Then the latch must be opened. Thus, the pulse generator 22 in this case is active to generate a rising edge of the control pulse in a clock event of the clock at the clock input 24.

Thus, triggered by the clock and/or a clock event, i.e., for example, a rising or a falling edge or both edges, a rising edge of the control pulse is generated which results in the latch memory being opened. A data value at the data input 14 is then read into the latch memory. As soon as the latch memory outputs this data value at the output in a stable manner, comparison signal 20 is returned to the 0 state, so that pulse generator 22 immediately generates the falling edge and closes the latch memory. In accordance with the invention, therefore, whenever a value is fully read into the latch memory, the latter is closed automatically, specifically by the falling edge of the control pulse.

Control pulse generator 22 is further configured to be ready for the generation of a control pulse if the comparison signal indicates that an input of memory means 10 and an output of memory means 10 have different values.

As has already been illustrated, control pulse generator 22 is further configured to generate a first edge of the control pulse at the clock input 24 as a function of a rising or falling edge of a clock pulse, so as to open memory element 10.

Control pulse generator 22 is thus configured to generate, in response to a clock event, the first edge of the control pulse only if, at the same time, the comparison signal indicates that the two signals at the input and output of the latch memory are different. In addition, as has been illustrated, pulse generator 22 is configured such that a second edge of the control pulse which re-closes the latch memory will be generated only if the comparison signal indicates that the input value present at the memory is equal to the output value output by the memory, this indicating that the input value has been read into latch memory 10 in a correct and neat manner.

Preferably, feedback means 16 will comprise a linear gate, such as an XOR gate, if the input value is compared to the latch output value, or an XNOR gate if the input value is compared to the negated output value. In addition, a buffer amplifier 26 is also preferably provided at the output of the latch memory, the buffer amplifier 26 being configured as an inverter if the output of the latch memory is the negated output value $\overline{Q}$.

Figure 11:
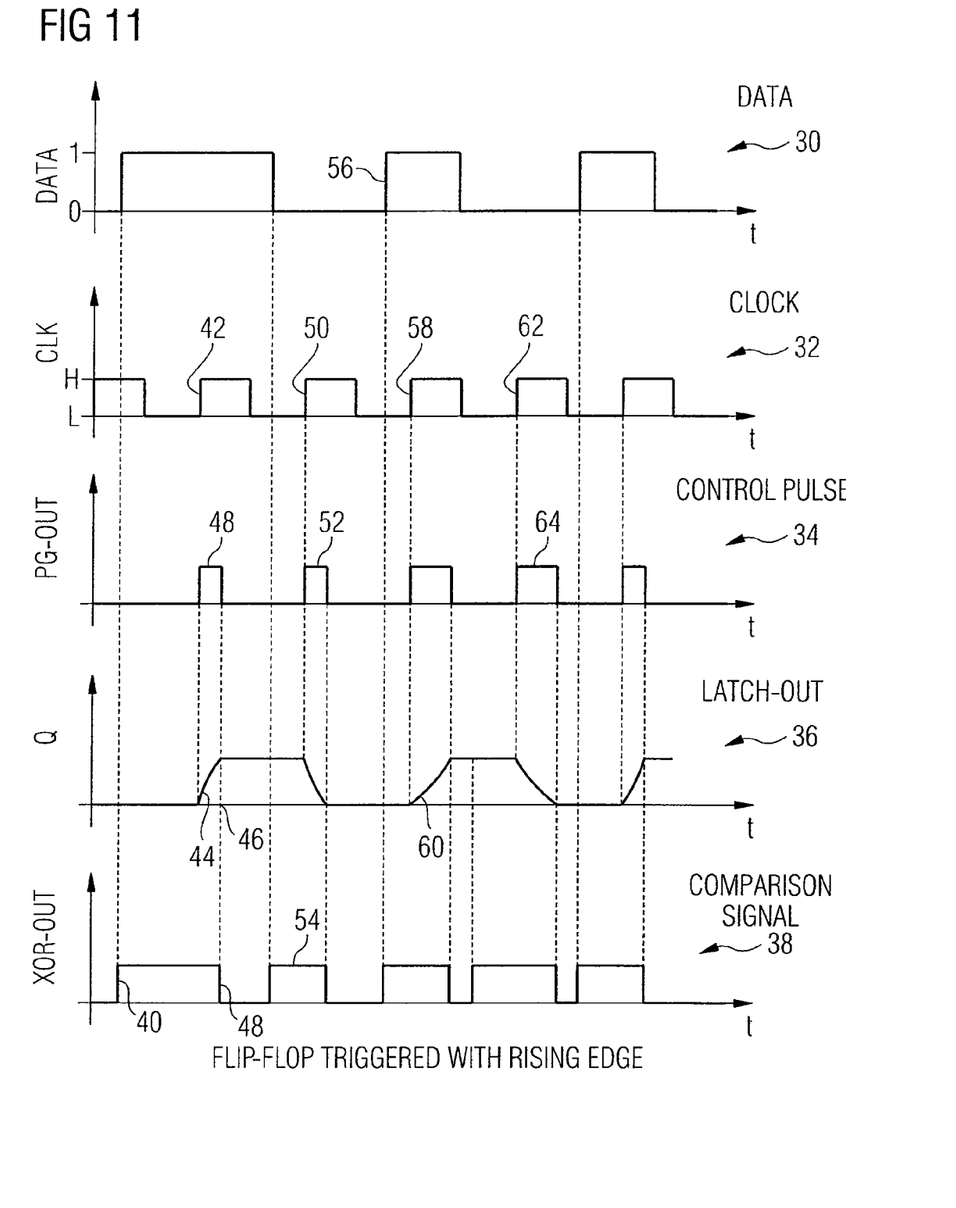
FIG. 11 is a time diagram of the flip-flop signals by way of example of a single-edge flip-flop.

With reference to FIG. 11, the time response of the inventive circuit will be set forth below. By way of example, a data curve is depicted at 30. A clock curve is shown at 32. The partial image 34 depicts a sequence of control pulses, whereas the partial image 36 in FIG. 11 represents the latch output signal at the output 18. The comparison signal 20, which is provided at the output of feedback means 16 of FIG. 1, is depicted by partial image 38 in FIG. 11. In the embodiment shown in FIG. 11, a single-edge triggered flip-flop is shown, i.e. a flip-flop which samples the data input at the rising edge of the clock. Independently of the clock signal, the comparison signal goes to a high state at 40, since at this moment in time, the data signal transitions from a 0 state to the 1 state. Due to the fact that the comparison signal 20 goes to the high state at the moment 40, the pulse generator 22 is in an activated state. The rising edge of the control pulse is generated when a next rising clock edge 42 arrives. At this moment, latch memory 10 is opened, and a data value is read in, as is depicted by a schematic oblique curve 44 of output signal Q of the latch memory. As soon as output value Q of the latch memory reaches its high state, which is the case at time 46, the falling edge of control pulse 48 will be provided. This fact, i.e. the fact that output value Q of the latch memory equals the input value DATA of the latch memory, is detected by the falling edge 48 of the first XOR output pulse, this falling edge being synchronous to the falling edge of the control pulse.

The latch output state Q is maintained for such time until a next rising edge 50 of the clock signal arrives. Whether this rising edge leads to the latch memory opening, i.e. whether this rising edge 50 gives rise to a new control pulse 52, depends on whether the comparison signal is in the "1" state at the moment of the clock edge 50, which is indicated at 54 in FIG. 11. If the XOR output signal was still in the "0" state at the moment of the rising edge 50 of the clock, which would be the case if the "1" state of the data had lasted until after the rising edge 50, the rising edge 50 of the clock would be "blacked out", i.e. would have no relevance whatsoever, since this rising clock edge would cause no control pulse (such as control pulse 52).

However, since the data signal is in the 0 state at the time of the rising edge 50 of the clock, the latch memory is opened at the moment of the rising edge 50, and transitions to the 0 state. Control pulse 52 then has its falling edge when the latch memory is also in the 0 state on the output side, since the comparison signal, i.e., the XOR output pulse 54, will have its falling edge. At time 56, the data signal goes to the high state again, which will immediately lead to the comparison signal rising. The next rising edge 58 of the clock signal again causes the latch to be opened, which is signalled by a rising waveform 60. The latch memory will maintain its state for such time until the next rising clock edge 62 arrives. Since the data signal is on "0" at the time of the rising edge 62, the latch will be opened again and unloaded, the control pulse 64 having its falling edge once the latch is unloaded.

The inventive flip-flop device is advantageous in that a readiness of the pulse generator to generate the control pulse is generated, by activating the pulse generator by means of the comparison signal, only if a data change has actually occurred. In addition, the falling edge of the control pulse will be synchronous with the falling edge of the comparison signal, so that the latch memory will be closed again once the input value has been neatly stored into the latch memory, which is immediately verified by the currently present output value of the latch memory.

Figure 3:
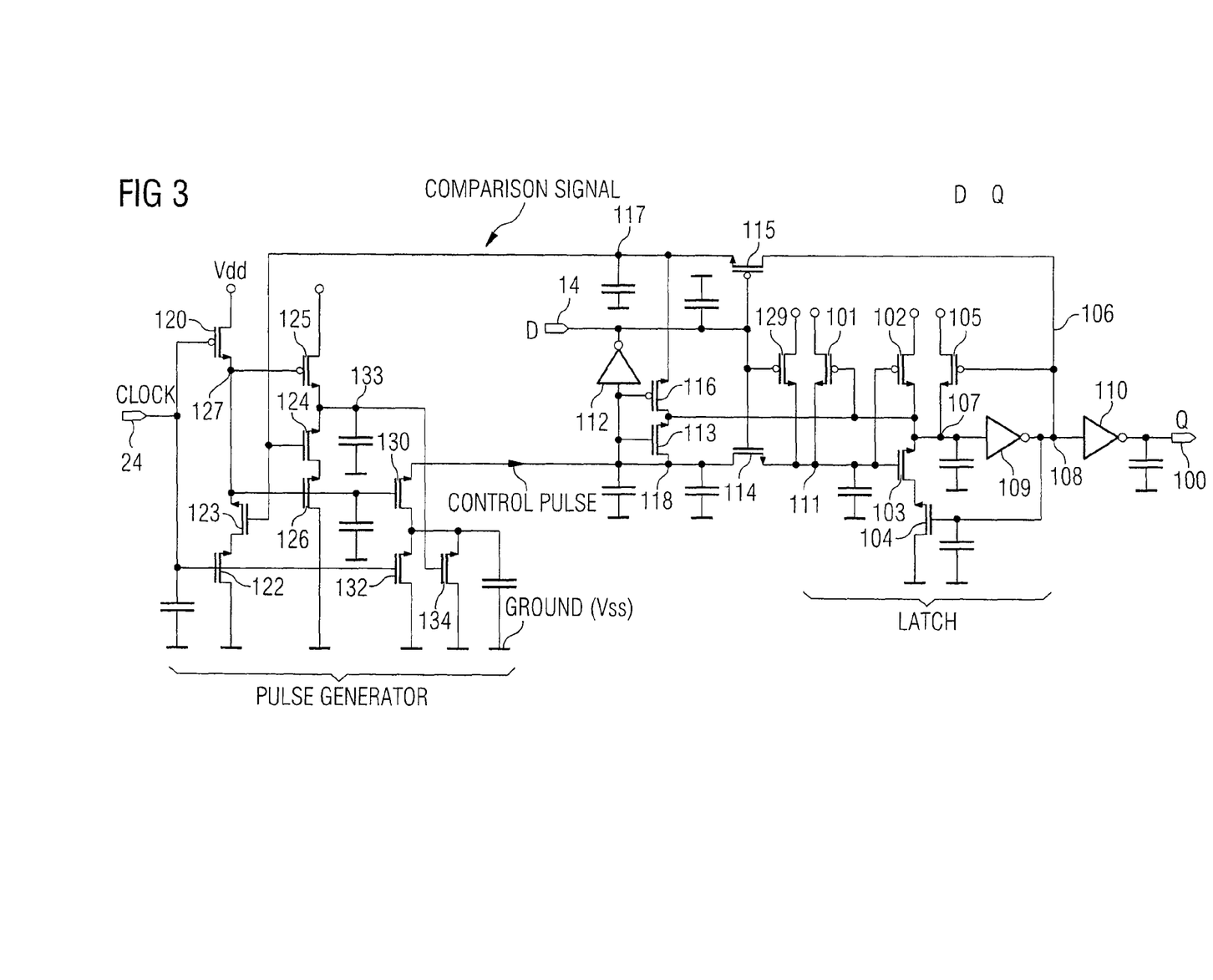
FIG. 3 is an inventive flip-flop cell.

With reference to FIGS. 3 to 10, various transistor implementations of the inventive circuit will be set forth below. A so-called D-Q flip-flop as is depicted in FIG. 3 includes data input 14, clock input 24 and an output Q 100. A latch memory is realized by the circuit elements which may be seen in the right-hand third of FIG. 3. These include an input transistor 101, two further transistors 102, 103, a further transistor 104 as well as a transistor 105 which is controlled by a feedback path 106. In addition, an inverter 109 is connected between the output of the latch memory (node 108) and an internal node 107. In addition, a further inverter 110 is connected between the latch output 108 and the Q output of the flip-flop device. This inverter 110 is necessary when the latch memory, as is preferred for the embodiment shown in FIG. 3, provides, on the output side, the negated output value $\overline{Q}$ rather than output value Q, which is supposed to be present at output 100.

The input data is provided via the data input symbolized by node 111. Node 111 is fed by a data input stage including an inverter 112, a transistor 113 and a transistor 114. Feedback means 106 for comparing the latch input value with the latch output value is provided by two transistors 115 and 116, transistor 115 being coupled to feedback path 106 if transistor 116 is controlled by the data signal provided at input 14 (following an inversion by inverter 112).

The comparison signal and/or enable signal is present at a node 117, whereas the control pulse and/or the pulse generator control signal is present at a node 118. The pulse generator 22 as is depicted in FIG. 1 is formed by a front part of the circuit of FIG. 3. Specifically, the pulse generator comprises a first transistor 120 as well as a second transistor 122, both controlled by clock input 24. A further transistor 123 as well as a further transistor 124 are directly controlled by the comparison signal. Transistors 125 and 126 are controlled by an intermediate potential 127 between the two input-clock controlled transistors 120, 122. In addition, the intermediate potential at node 127 controls a further transistor 130. Also, clock input 24 controls a further transistor 132. A potential at an intermediate node 133 controls a further transistor 134.

The flip-flop depicted in FIG. 3 is a double-edge triggered flip-flop because of transistor 134. If transistor 134 was dispensed with, the double-edge triggered flip-flop depicted in FIG. 3 would become a single-edge triggered flip-flop.

In addition, the fat black dots in FIG. 3 represent a high voltage supply state, also referred to as Vdd, whereas the other potential terminals represent a circuit ground or—generally speaking—a different reference potential (e.g. Vss) and are characterized, as is customary, by an inverted "T" symbol. The capacitances drawn in the circuit serve to simulate run times and may be employed in implementations, even though a pure transistor implementation without capacitances is preferred.

Figure 4:
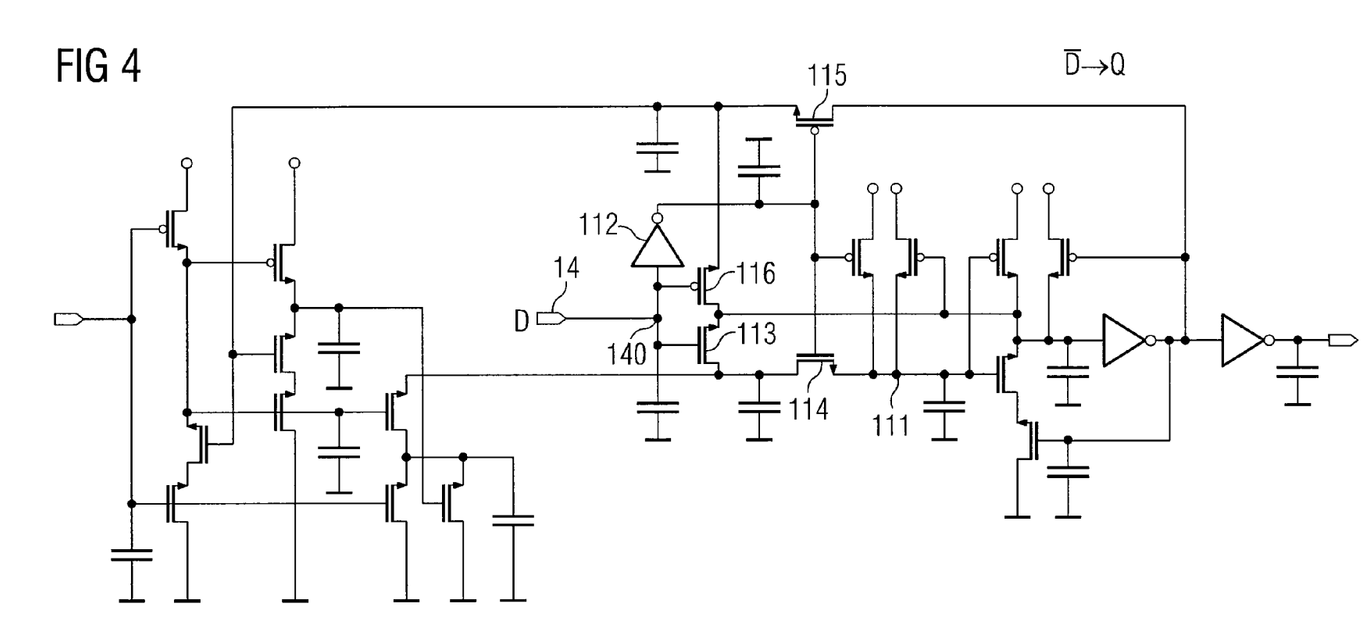
FIG. 4 is an inventive negated flip-flop cell.

The alternative implementation depicted in FIG. 4 differs from FIG. 3 in that the data input 14 is accommodated at an intermediate node 140 of the data input stage formed by elements 112, 113, 114. Thus, all data values pass through inverter 112 before reaching the XOR gate formed by transistors 115, 116. On the other hand, the data values are now no longer inverted, in comparison to the configuration of FIG. 3 at FIG. 4, before they enter into data input 111 for the latch memory.

Figure 5:
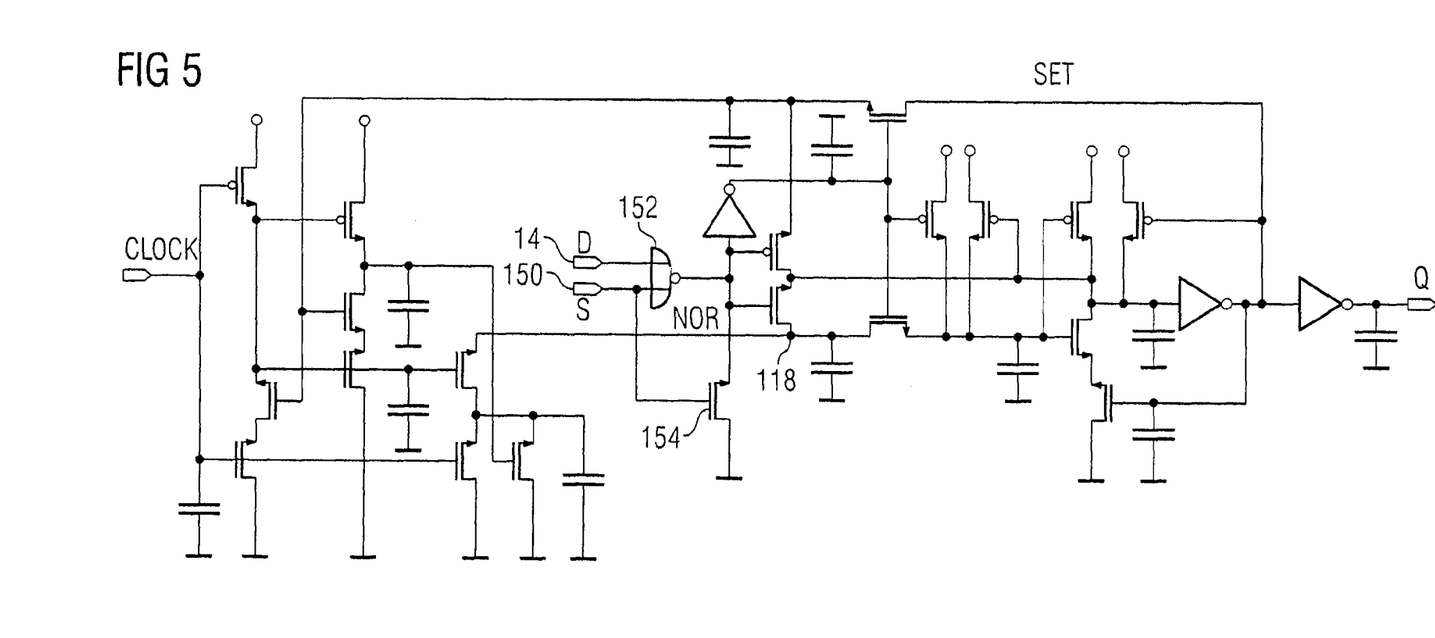
FIG. 5 is a flip-flop cell having a set function.

FIG. 5 shows an embodiment of an inventive flip-flop having a set function. In addition to data input 14, a set input 150 is now provided, the data input and the set input being linked in a NOR gate 152. In addition, a further transistor 154 is provided which short-circuits control pulse node 118 when the set input has a logically high state. As soon as the set input has a logically high state, a data value Q is thus output which, once the control pulse is deactivated, remains for such time until the set input is cleared again.

Figure 6:
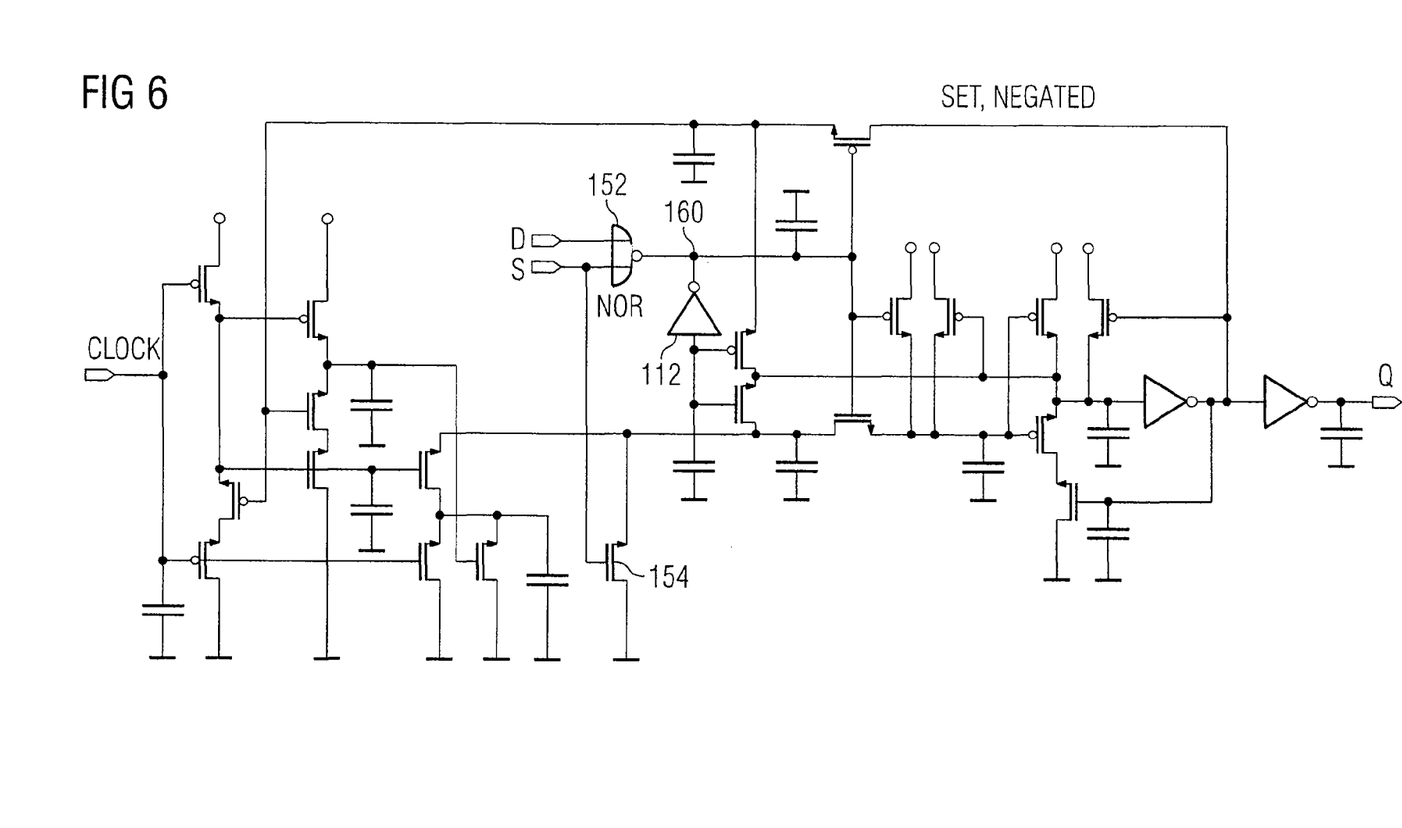
FIG. 6 is a negated flip-flop cell having a set function.

FIG. 6 shows an alternative implementation of FIG. 5, the output of the NOR gate 152 being connected to an intermediate node 160 located above inverter 112 (rather than below inverter 112, as in FIG. 5).

Figure 7:
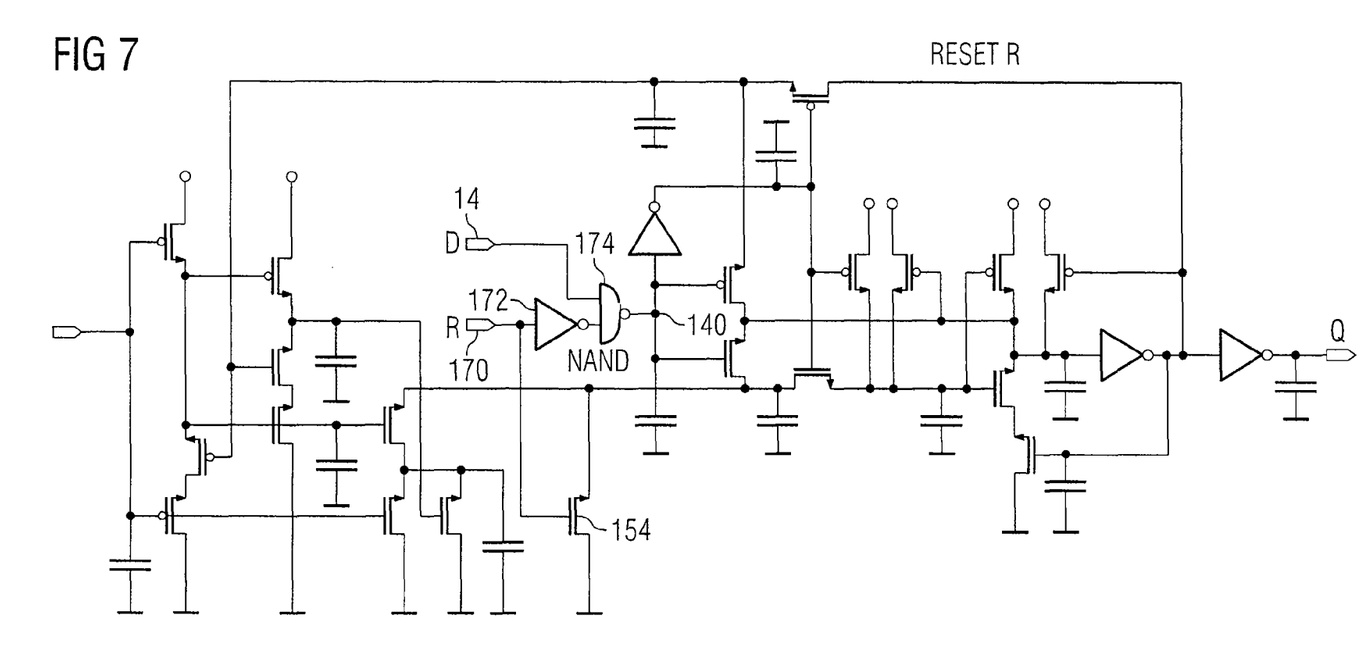
FIG. 7 is a flip-flop cell having a reset function.

In the embodiment shown in FIG. 7, instead of the set input, a reset input 170 is used which at the same time controls transistor 154 so as to deactivate the control pulse when the reset input is high. The reset signal at the reset input 170 is inverted by an inverter 172, and fed to a NAND 174. In addition, NAND gate 174 is fed the data signal at data input 14. The output of NAND gate 174 is again coupled to intermediate node 140.

The reset input ensures that a logically low state is obtained at the output Q of the flip-flop independently of what is present on the input side and independently of whether any, or which types of, intermediate states are present, when the signal at reset input 170 is put into the high state.

Figure 8:
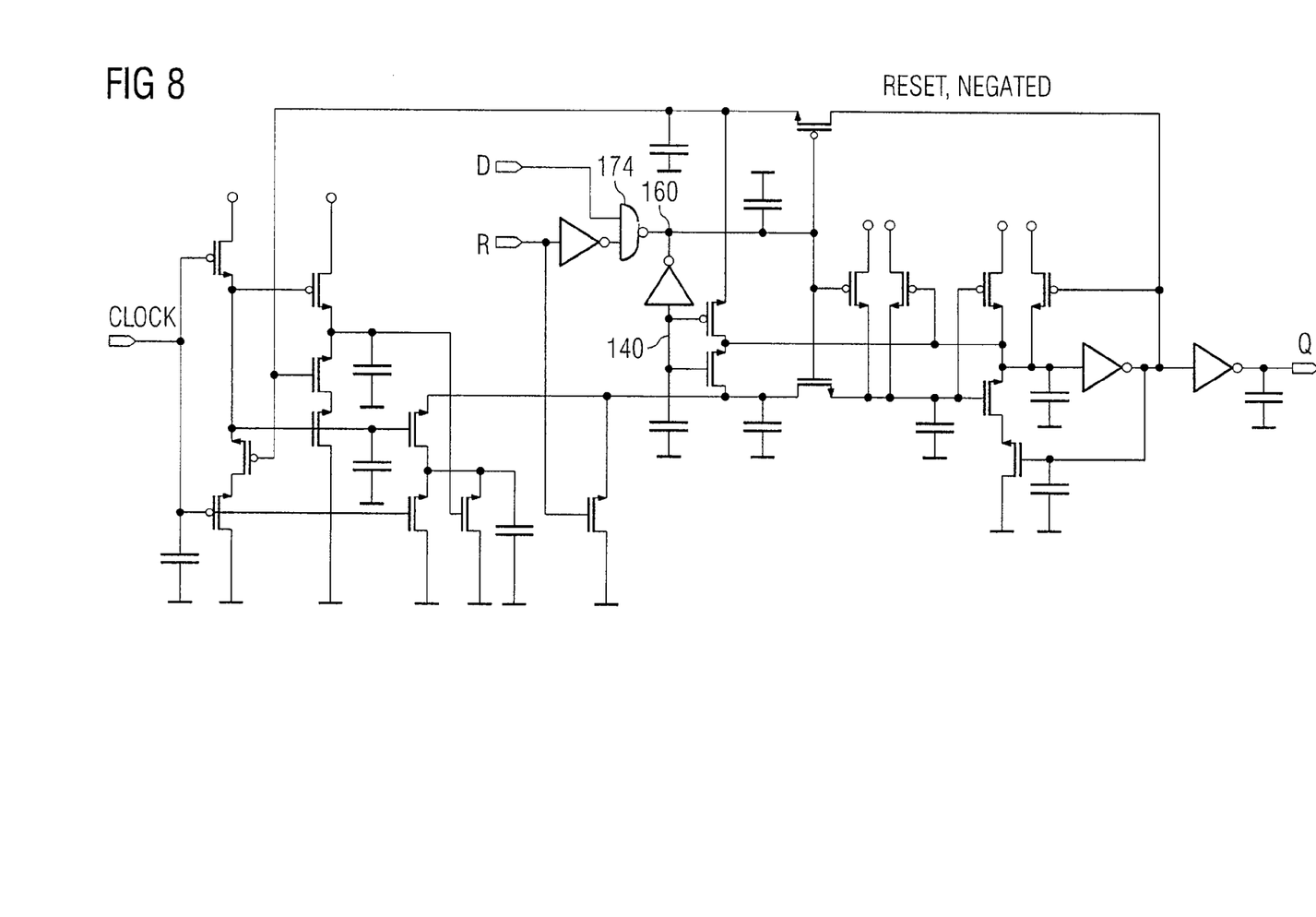
FIG. 8 is a negated flip-flop cell having a reset function.

The embodiment shown in FIG. 8 depicts a negated flip-flop implementation having a reset function which differs, in turn, in that the output of NAND gate 174 is connected to node 160 rather than to intermediate node 140.

Figure 9:
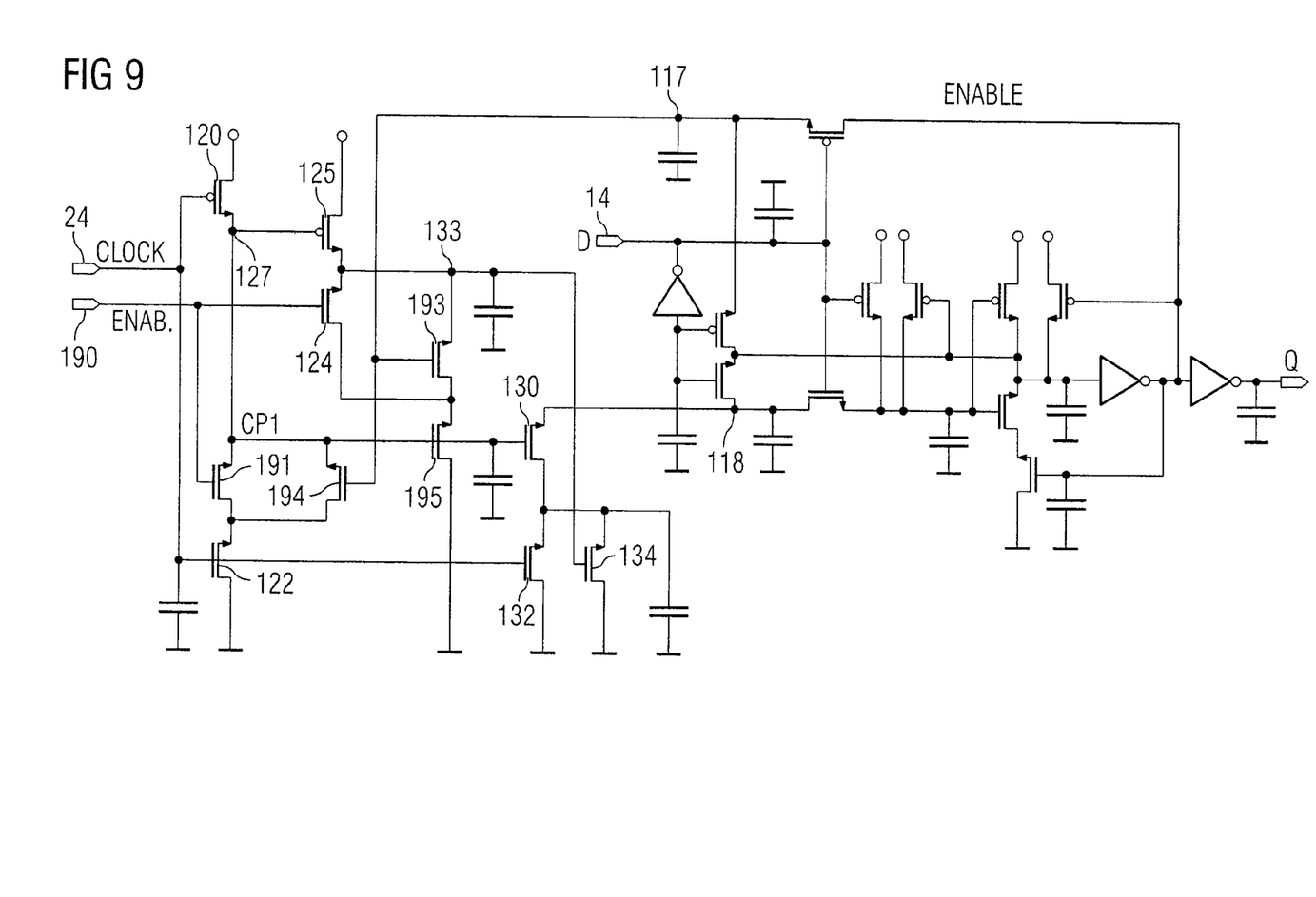
FIG. 9 is a flip-flop cell having an enable function.

FIG. 9 depicts a further embodiment of the present invention, which additionally has an enable function as compared to the other implementations. For example, an enable signal 190 is input via the enable input. This signal is passed to a transistor 191 and to a transistor 124. Unlike the previous implementations of the pulse generator which already included the transistors 194 and 193, further transistors 191 and 124 are additionally present which are connected in parallel with the two other transistors 193 and 194, as may be seen from FIG. 9. Just like transistor 194, this transistor also obtains the comparison signal at node 117 as a control signal. A further transistor 195 obtains the intermediate potential 127 as the control signal. By means of a low-enable signal at the input 190, one achieves that a deactivation of pulse generator 22 is achieved independently of the actual enable signal present at node 117. In other words, the enable signal results in that the comparison signal 20 in FIG. 1 has a "zero" state.

Figure 10:
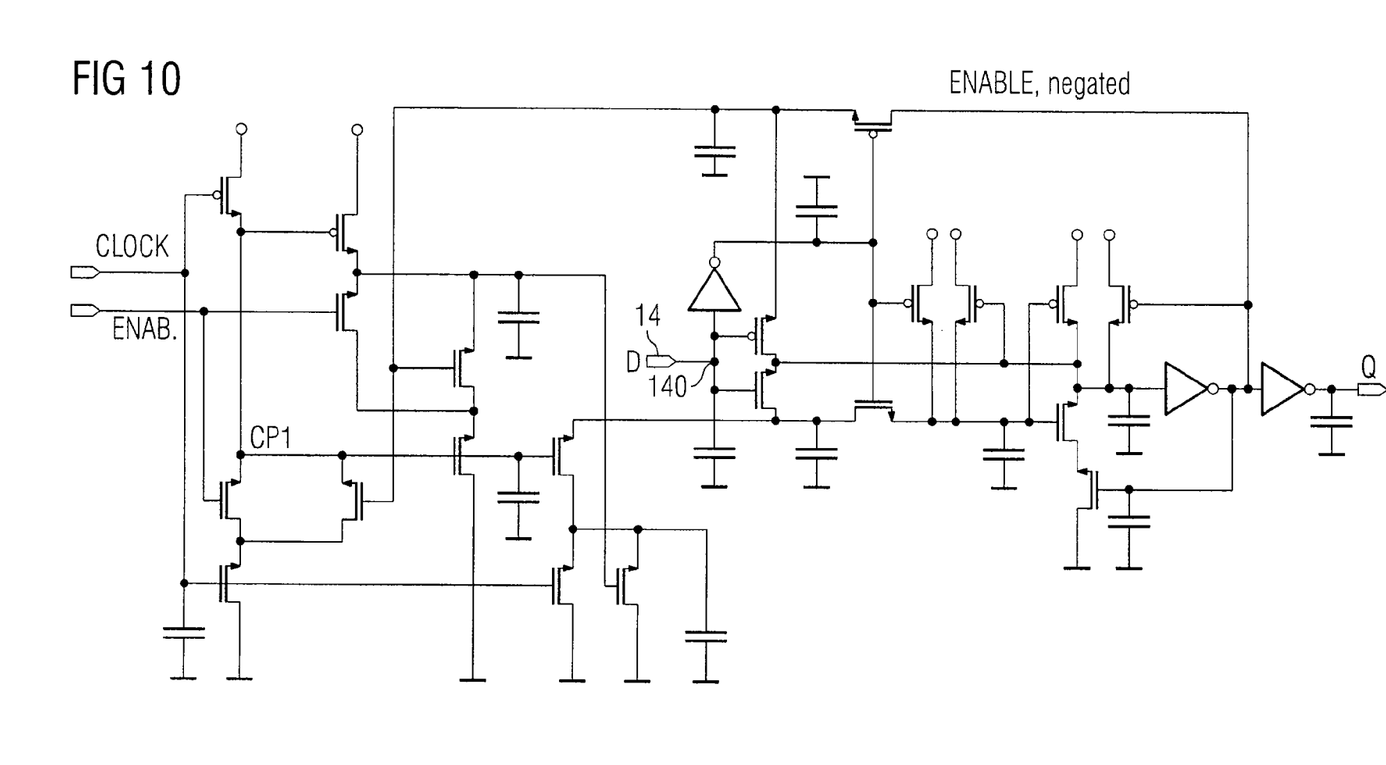
FIG. 10 is a negated flip-flop cell having an enable function.

The implementation of the flip-flop having an enable function of FIG. 10 differs from FIG. 9 in that clock input 14 is again coupled to intermediate potential 140 so that a non-negated output value Q is achieved on the basis of a negated data value.

The implementations in FIG. 3 to 10 are particularly advantageous in that they are performed in a highly transistor-saving manner. For the version of FIG. 3, for example, an overall number of less than 20 transistors is enough to implement a complete flip-flop. Moreover, all additional functionalities as are depicted in FIGS. 4 to 10 may readily be implemented into the basic design of FIG. 3 in a modular manner, as it were, which corresponds to a common implementation by means of layout libraries. In accordance with the invention, no special application-specific implementations are necessary, but a universal design concept is provided wherein the basic version of the flip-flop may readily be adapted to specific application scenarios by means of different functionalities, without the standard design advantage being lost.

In the transistor implementation, such as in FIG. 3, transistors 102, 105 are PMOS transistors, and transistors 103, 104 are NMOS transistors. Equally, the fat dots represent positive supply voltage deliveries Vdd, whereas the other reference potential is the ground potential or, generally, Vss. In the transistor implementations, the types of transistors (PMOS, NMOS) may be interchanged. For this purpose, it will then be necessary to also interchange the reference potentials Vss and Vdd.

Further it is to be noted that the description of the flip-flop of FIG. 1 is based on a control pulse which has a logically low state and which, when it has a rising edge, transitions to a logically high state to then transition back to its logically low state at a falling edge. However, the same functionality may also be achieved when the control pulse waveform is normally in a logically high state so as to then switch to a low state when the latch memory is to be opened, and to transition again to the logically high state, by means of a rising edge, when the latch memory is to be closed again.

Equally, the comparison signal need not necessarily have a logically high state in order to activate the pulse generator. It could equally normally have a logically high state wherein the pulse generator is deactivated, so as to then transition to a logically low state when the pulse generator 22 is to be activated.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A flip-flop device for storing and outputting a data value, comprising:
a controllable memory element, to be opened as a function of a control pulse, configured to store a present data value, and to output the data value;
a feedback unit configured to compare the present data value and a value output by the memory element, and to output a comparison signal;
a clock input configured to receive a clock signal; and
a control pulse generator configured to generate the control pulse as a function of the comparison signal, wherein the control pulse generator is configured to generate a first edge of the control pulse only at a clock edge of the clock signal, so as to open the memory element, and wherein the control pulse generator is adapted to generate a second edge of the control pulse following the first edge of the control pulse not dependent on a falling edge or a rising edge of the clock signal and precisely at a time, where the comparison signal indicates that an input of the memory element and an output of the memory element comprise the same values, so as to close the memory element.

2. The flip-flop device as claimed in claim 1, wherein the control pulse generator is configured to generate the control pulse only if the comparison signal indicates that the input of the memory and the output of the memory comprise different values.

3. The flip-flop device as claimed in claim 1, wherein the control pulse generator is further configured to generate the first edge of the control pulse only if, at the same time, the comparison signal indicates that the input of the memory element and the output of the memory element comprise different values.

4. The flip-flop device as claimed in claim 1, wherein the feedback unit comprises an XOR gate or an XNOR gate.

5. The flip-flop device as claimed in claim 1, wherein the memory is a latch memory.

6. The flip-flop device as claimed in claim 1, wherein the control pulse generator is configured to provide the first edge of the control pulse for each edge of the clock signal or for every other edge of the clock signal.

7. The flip-flop device as claimed in claim 1, further comprising a data input stage configured to process the data signal or a negated version of the data signal.

8. The flip-flop device as claimed in claim 1, further comprising a resetter configured to bring, in the event of a reset signal, a data input to a logical 0, and to bring a control pulse line to a logical 0.

9. The flip-flop device as claimed in claim 1, further comprising a setter configured to bring, in the event of a set signal, a data input to a logical 1, and to bring a control pulse line to a logical 0.

10. The flip-flop device as claimed in claim 1, further comprising an enabler for external enable signalling, configured to deactivate the control pulse generator independently of different output and/or input states of the memory.

11. The flip-flop device as claimed in claim 1, wherein the control pulse generator comprises:
a first PMOS transistor connected between a supply voltage access and a first intermediate node;
a second NMOS transistor connected between the first intermediate node and a third NMOS transistor, the first PMOS transistor and the third NMOS transistor being controllable by the clock signal,
a fourth NMOS transistor connected between a fifth PMOS transistor and a supply potential,
a sixth NMOS transistor connected between the fourth NMOS transistor and a ground potential,
a seventh NMOS transistor connected between a control pulse output and via an eighth NMOS transistor to a ground potential, the fourth NMOS transistor and the third NMOS transistor being controllable by the comparison signal at a comparison signal node, the fifth PMOS transistor and the sixth NMOS transistor being controllable by the first intermediate node, the seventh NMOS transistor providing the control pulse on the output side and being controllable by the intermediate node, and the eighth NMOS transistor being controllable by the clock input.

12. The flip-flop device as claimed in claim 11, further comprising a ninth NMOS transistor coupled to an output of the fifth PMOS transistor and causing a double-edge triggered flip-flop device to be acquired.

13. The flip-flop device as claimed in claim 1, wherein the comparator comprises:

a feedback line connected to an output of the latch memory, a first PMOS transistor and a second PMOS-transistor, outputs of the first PMOS transistor and of the second PMOS transistor forming an intermediate node at which the comparison signal may be generated, and the first PMOS transistor being controllable by a data signal, and the second PMOS transistor being controllable by a negated data signal.

14. The flip-flop device as claimed in claim 1, further comprising a data input stage, comprising:

a first inverter, a first NMOS transistor, a second NMOS transistor, and a third PMOS transistor, the third PMOS transistor and the second NMOS transistor controllable by the data signal, the first NMOS transistor controllable by a negated data signal, and the second NMOS transistor being connected between a data input node and a control pulse node.

15. The flip-flop device as claimed in claim 1, wherein the memory element comprises:

a first PMOS transistor, a second PMOS transistor, a third NMOS transistor, a fourth NMOS transistor, a fifth PMOS transistor, and an inverter connected between the fifth PMOS transistor and an output node, the first PMOS transistor being connected between a supply voltage potential and a data input node, the second PMOS transistor and the third NMOS transistor forming another inverter connected to a ground potential via the fourth NMOS transistor, the fourth NMOS transistor being controlled by an output potential at the output node, and the fifth PMOS transistor being controlled by the output potential at the output node.

16. A method for storing and outputting a data value, comprising:

storing a present data value using a controllable memory element which is controllable to be open as a function of a control pulse, and outputting the stored data value on an output side of the memory element;

comparing the present data value and a value output by the memory element, and outputting a comparison signal;

receiving a clock signal; and generating the control pulse as a function of the comparison signal, wherein a first edge of the control pulse is generated only at a clock edge of the clock signal, so as to open the memory element, and wherein a second edge of the control pulse following the first edge of the control pulse is generated not dependent on a falling edge or a rising edge of the clock signal and precisely at a time, where the comparison signal indicates that an input of the memory element and an output of the memory element comprise the same values, so as to close the memory element.

17. A flip-flop device for storing and outputting a data value, comprising:

a controllable memory means, to be opened as a function of a control pulse, for storing a present data value, and for outputting the data value;

a feedback means for comparing the present data value and a value output by the memory element, and for outputting a comparison signal;

a clock input means for receiving a clock signal; and a control pulse generating means for generating the control pulse as a function of the comparison signal, wherein the control pulse generating means is adapted to generate a first edge of the control pulse only at a clock edge of the clock signal, so as to open the memory element, and wherein the control pulse generating means is adapted to generate a second edge of the control pulse following the first edge of the control pulse not dependent on a falling edge or a rising edge of the clock signal and precisely at a time, where the comparison signal indicates that an input of the memory element and an output of the memory element comprise the same values so as to close the memory element.

18. A flip-flop device for storing and outputting a data value, comprising:

a controllable memory element, to be opened as a function of a control pulse, configured to store a present data value, and to output the data value;

a feedback unit configured to compare the present data value and a value output by the memory element, and to output a comparison signal; and a control pulse generator configured to generate the control pulse as a function of the comparison signal, wherein the control pulse generator comprises:

a first PMOS transistor connected between a supply voltage access and a first intermediate node;

a second NMOS transistor connected between the first intermediate node and a third NMOS transistor, the first PMOS transistor and the third NMOS transistor being controllable by the clock signal, a fourth NMOS transistor connected between a fifth PMOS transistor and a supply potential, a sixth NMOS transistor connected between the fourth NMOS transistor and a ground potential, a seventh NMOS transistor connected between a control pulse output and via an eighth NMOS transistor to a ground potential, the fourth NMOS transistor and the third NMOS transistor being controllable by the comparison signal at a comparison signal node, the fifth PMOS transistor and the sixth NMOS transistor being controllable by the first intermediate node, the seventh NMOS transistor providing the control pulse on the output side and being controllable by the intermediate node, and the eighth NMOS transistor being controllable by the clock input.

* * * * *